United States Patent
Caillat et al.

(10) Patent No.: US 6,563,039 B2
(45) Date of Patent: May 13, 2003

(54) THERMOELECTRIC UNICOUPLE USED FOR POWER GENERATION

(75) Inventors: Thierry Caillat, Pasadena, CA (US); Jean-Pierre Fleurial, Duarte, CA (US); Alexander Borshchevsky, Santa Monica, CA (US); G. Jeffrey Snyder, Altadena, CA (US); Andrew Zoltan, Walnut, CA (US); Leslie Zoltan, Glendora, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 09/765,062

(22) Filed: Jan. 17, 2001

(65) Prior Publication Data

US 2002/0014261 A1 Feb. 7, 2002

Related U.S. Application Data

(60) Provisional application No. 60/176,980, filed on Jan. 19, 2000.

(51) Int. Cl.[7] .............................................. H01L 35/28
(52) U.S. Cl. .................. 136/205; 136/206; 136/237; 136/236.1; 136/238; 136/240; 252/62.3 T
(58) Field of Search .................. 136/203, 205, 136/237, 236.1, 238, 240; 252/62.3 T

(56) References Cited

U.S. PATENT DOCUMENTS

| | | | | |
|---|---|---|---|---|
| 3,208,835 A | * | 9/1965 | Duncan et al. | 136/201 |
| 3,231,965 A | * | 2/1966 | Roes | 136/201 |
| 3,564,860 A | * | 2/1971 | Reich et al. | 136/205 |
| 4,922,822 A | * | 5/1990 | Bierschenk et al. | 136/204 |
| 5,006,178 A | * | 4/1991 | Bijvoets | 136/203 |
| 5,929,351 A | * | 7/1999 | Kusakabe et al. | 136/201 |

* cited by examiner

Primary Examiner—Nam Nguyen
Assistant Examiner—Thomas H. Parsons
(74) Attorney, Agent, or Firm—Fish & Richardson P.C.

(57) ABSTRACT

A high-efficiency thermoelectric unicouple is used for power generation. The unicouple is formed with a plurality of legs, each leg formed of a plurality of segments. The legs are formed in a way that equalized certain aspects of the different segments. Different materials are also described.

26 Claims, 3 Drawing Sheets

THERMOELECTRIC UNICOUPLE USED FOR POWER GENERATION

CROSS-REFERENCE TO RELATED APPLICATIONS

This application claims priority from provisional application No. 60/176,980, filed Jan. 19, 2000.

BACKGROUND OF THE INVENTION

1. Field of the Invention

Not Applicable

2. Description of the Related Art

Thermoelectric generator devices can be used to create electrical energy based on temperature differentials. Many different thermoelectric materials and forms are known. It is often desirable to operate a thermoelectric generator over a large temperature gradient to increase higher thermal to electrical efficiency. For example, thermoelectric generators may be used in applications such as deep space missions, where other generators might have difficulties in operation.

No single thermoelectric material has been suitable for use over a very wide range of temperatures, e.g. such as between 300 and 1000 degrees Kelvin. Prior art techniques have used different thermoelectric materials and have been limited to relatively narrow temperature ranges. Each material is used in the range where it possesses the optimum performance.

Generators are known which include a multistage thermoelectric generator where each stage operates over a fixed temperature difference and is electronically insulated but thermally in contact with the other stages. An alternative approach uses segmented unicouples/generators, having p and n type materials, formed of different material segments but joined in series.

SUMMARY

The present system describes a generator or unicouple formed of segmented thermoelectric parts. The unicouple may be formed of special thermoelectric materials including skutterudites, $Zn_4Sb_3$ materials and BiTe based materials. Specific materials may include $Zn_4Sb_3$ materials, $CeFe_4Sb_{12}$ based alloys, both of which are p type materials. N type materials may also be used including $CoSb_3$ based alloys.

BRIEF DESCRIPTION OF THE DRAWINGS

These and other aspects will now be described in detail with reference to the accompanying drawings, wherein.

DETAILED DESCRIPTION OF THE INVENTION

Thermoelectric generators may have many different applications. As described above, thermoelectric generation can be used in radioisotope thermoelectric generators for deep space missions. It can be used for recovering energy waste heat from heat generation processes such as industrial processes or vehicle exhaust.

It is often desirable to operate such a generator over a large temperature difference to achieve high thermal to electrical efficiency values.

The present application teaches improving efficiency by forming a segmented unicouple device. The device has n type and p type legs which are segmented into segments made of different materials. The materials are selected to increase the average thermoelectric figure of merit of the legs. This allows operating the unicouple over relatively large temperature gradients.

The specific segmented unicouple uses alternating P and N type legs. The specific materials include P type materials which can include p-type $Bi_2Te_3$ based alloys and/or $Zn_4Sb_3$ or $CeFe_4Sb_{12}$ based alloys, and n type materials which can include n type $Bi_2Te_3$ based alloys, and/or $CoSb_3$ based alloys. These specific materials are described in further detail in the literature.

Figure 1:
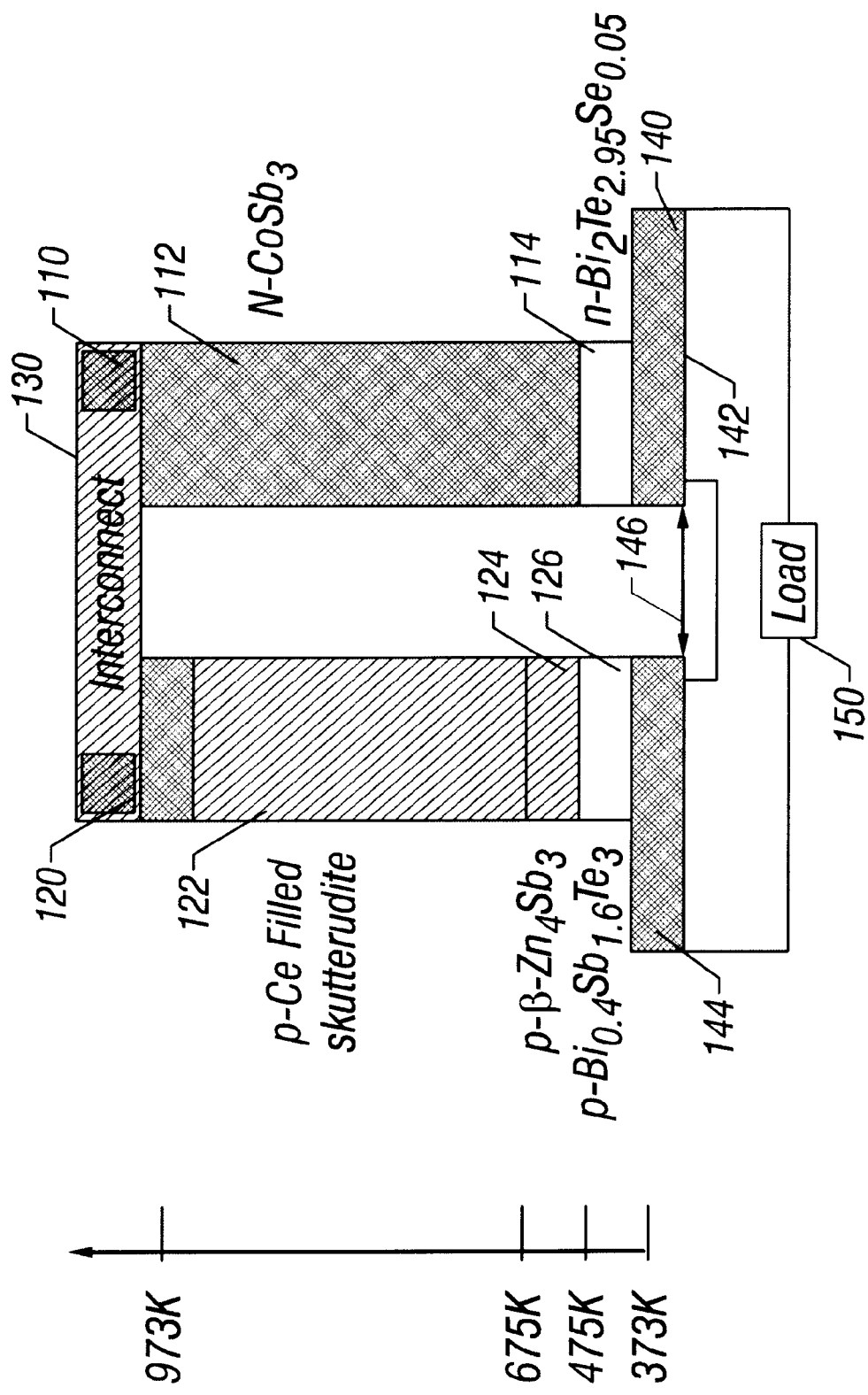
FIG. 1 shows a segmented unicouple.

An embodiment is shown in FIG. 1. The FIG. 1 embodiment shows a segmented unicouple formed of the materials described above with a 973 degrees K hot side and a 300 degrees K cold side. Each segment preferably has the same current and/or heat flow as other segments in the same leg, or currents and/or heat flows within 10% of others in the same leg. A profile is defined which keeps interface temperatures at their desired level. In order to do this, the geometry of the legs is optimized. Each of the two legs 110, 120 may have a number of segments, at least one, more preferably two segments. For example, the leg 110 include segments 112 and 114. The segment 112 is formed of the N type material $CoSb_3$. The segment 114 is formed of the N type material n-$Bi_2Te_{2.95}Se_{0.03}$. The length of segment 112 is different than the length of segment 114. Correspondingly, the leg 120 which is formed of P type materials includes a first segment 122 of P type Ce filled skutterudite, a second section 124 of —B— $Zn_4Sb_3$ and a third section 126 of —$Bi_{0.4}Sb_{1.75}Te_3$. The ratio between the different sections is approximately 0.6:0.5: 2.74 for the P type legs 122, 124, 126, and 0.5: 3.3 for the N type legs 112, 114 for a 975K hot side and a 300K cold side temperature of operation. The top thermoelectric materials segments can also be bonded to a top metallic segment with a thickness between 100 microns and 2 mm shown as 130 in FIG. 1) and can be made out of a metal such as Ti or Nb for example.

A cold side of the material includes the two BiTe based materials, specifically $Bi_2Te_{2.7}Se_{0.3}$ and $Bi_{0.25}Sb_{0.75}Te_3$. The cold side is located on the bottom of FIG. 1. The cold side is coupled to a cold shoe 140, which includes two different electrically insulated portions 142 and 144. A heat sink, shown generically as 146, may be coupled to the cold end to dissipate heat. The electrical connection to the leg power is a load shown as 150.

The hot side interconnect, at the top of FIG. 1, is connected to conducting part 130 which may electrically connect the P and N legs. This may be connected to a heater 135, as shown, or placed in the location of waste or exhaust to recover the electricity from the waste heat.

In addition, the ratio of the cross-sectional area between the N type leg 110 and P type leg 120 is optimized to account for differences in electrical and thermal conductivity between the two legs. In all of these calculations, the thermoelectric properties may be averaged for the temperature range in which the materials of the segment are used.

The relative lengths of the segments may be adjusted to ensure the energy balance at the interface and optimize the geometry of the segments for different hot side temperatures of operation. If it is assumed that there is no contact resistance between segments, then the device efficiency is not affected by the overall length of the device. Only the relative lengths of the segments then need to be optimized. The total resistance and power output, however, may depend on the overall length and cross-sectional area of the device.

In the real world, contact resistance between the segments may reduce the efficiency. In a preferred mode, the contact resistance may be less than 20 u-ohm-cm² in order to keep the efficiency from being degraded by this contact resistance.

For the bonding that is used herein, contact resistance should be within the above-discussed range, produces a bond which is mechanically stable in operation, and also acts as a diffusion barrier to prevent potential diffusion between the different materials, and has as similar coefficient of temperature expansion or intermediate coefficient of thermal expansion between the materials that it is bonding. The bonding is conducted by compacting by hot pressing, for example, fine powder of two materials with a thin metal interface layer of 10 to 100 $\mu$m in the form of a foil or powder between these materials.

Pressing is conducted, for example in a graphite die using graphite punches in argon atmosphere. For example, Pd may be used as an interface material between $Zn_4Sb_3$ and $Bi_{0.25}Sb_{0.75}Te_{34}$, between $CoSb_3$ and $Bi_2Te_{2.7}Se_{0.3}$ and also between $Zn_4Sb_3$ and Ce filled skutterudite compounds. Brazing the thermoelectric legs to the top metallic interconnect can be conducted using a brazing alloy such as CuAg-ZnSn.

Figure 3:
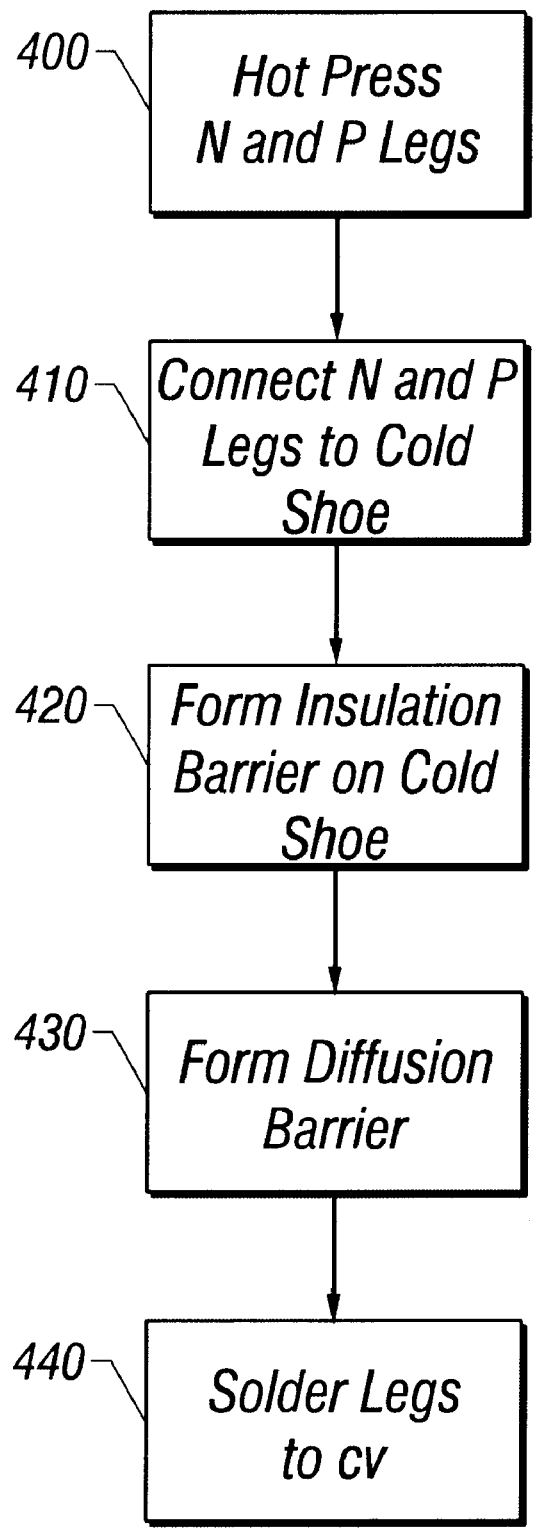
FIG. 3 shows a flowchart of operation.

Fabrication is carried out by fabricating the legs formed of the various thermoelectric materials which can also be topped by a metallic statement. The process is described with reference to the flowchart of FIG. 3.

At 400, each leg is hot pressed to form a complete individual leg in one operation using fine powder of each material. Foils including a noble metal such as Pd or Ti are introduced between the segments. In one embodiment, a Pd foil may be preferred. Hot pressing is done in a graphite die using an argon atmosphere and a temperature of 500° C.

At 410, each of the completed legs of N and P type are connected to a cold shoe. The cold shoe is used for the transfer to the heat sink.

The cold shoe may be a plate such as 140 in FIG. 1, and may be formed of any material which has good heat conducting but insulating properties. The plate for example may be made of Cu-plated alumina. The alumina plate may be 1.5 mm thick, plated with a 100 micron thick Cu layer on both sides. A small Cu strip is etched somewhere on the plate, e.g. in the center of the plate, to electrically insulate the legs at 420. A diffusion barrier material, such as nickel may then be electroplated on both the Cu and the lower segments of the legs at 430. This diffusion barrier may prevent the copper from diffusing into the materials, especially when the materials are based on $Bi_2Te_3$.

At 440, the legs are soldered to the Cu using a special kind of solder such as one formed of BiSn.

A heater may be connected to the top surfaces of the legs forming the hot junction. The heater may be connected using a Cu—Ag—Zn—Sn brazing alloy. The heater may be a special heater, formed of Nb and Ta and a heating element that are electrically insulated from the Nb material.

Figure 2:
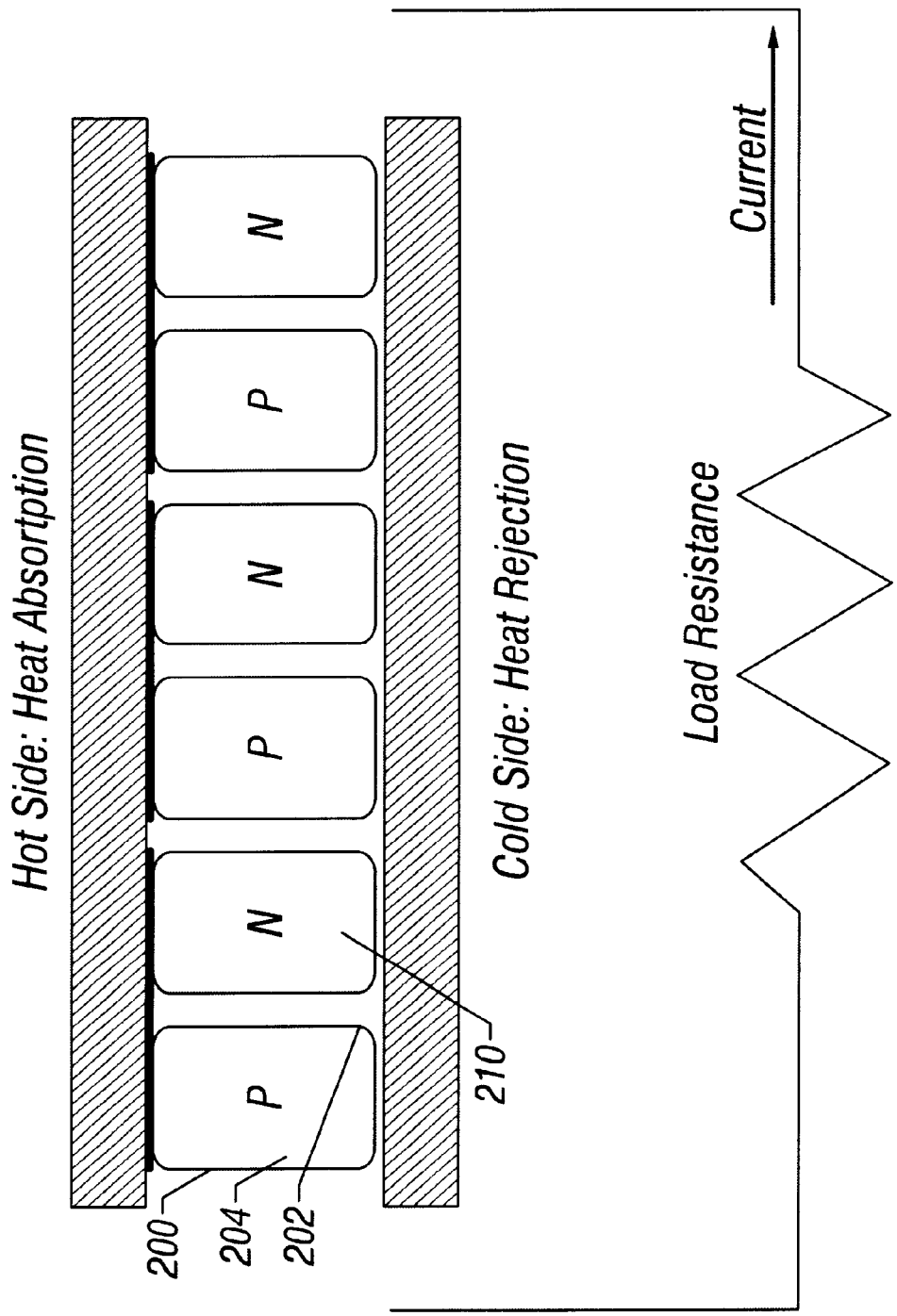
FIG. 2 shows a segmented multileg device.

FIG. 2 shows an alternative system using segmented legs in a multicouple segmented thermoelectric converter. Each leg such as leg 200, is formed of multiple segments shown as 202 and 204. Other legs, such as to 210 may be formed having other numbers of segments, and of different materials.

Although only a few embodiments have been disclosed in detail above, other modifications are possible. All such modifications are intended to be encompassed within the following claims, in which:

What is claimed is:

1. A thermoelectric unicouple, comprising:
    a first leg, formed of N type thermoelectric materials, said first leg having at least first and second segments formed of different N type thermoelectric materials, wherein said first and second segments have different lengths, and each length of each segment is adjusted to provide at least one of a same current and/or a same thermal conductivity across said segment;
    a second leg, formed of P type thermoelectric materials, said second leg having at least first and second segments formed of different P type thermoelectric materials and having different lengths, wherein each length of each segment is adjusted to provide at least one of the same current and/or the same thermal conductivity to the segment; and
    a connection between said first and second legs.

2. A unicouple as in claim 1, further comprising establishing one end of said unicouple as a hot end and another end as a cold end.

3. A unicouple as in claim 1, further comprising a load connection to each of said first and second legs, at an opposite end of said connection, said load connection producing a current output.

4. A unicouple as in claim 3, further comprising a thermal connection at the same end as said load connection, said thermal connection providing thermal contact between said legs but electrical insulation between said legs.

5. A unicouple as in claim 4, wherein said thermal connection comprises an element made of insulating material, and plated with a conductive material.

6. A unicouple as in claim 5, wherein said thermal connection is at the cold end.

7. A unicouple as in claim 5, wherein said insulating material is alumina.

8. A unicouple as in claim 1, wherein each of said first leg and said second leg include at least one segment formed of a $Bi_2Te_3$ material.

9. A unicouple as in claim 8, wherein said N type materials also include $CoSb_3$.

10. A unicouple as in claim 9, wherein a ratio between lengths of said segments is approximately 0.5 to 3.3.

11. A unicouple as in claim 8, wherein said P type materials also include a skutterudite material.

12. A unicouple as in claim 8, wherein said P type materials also include a $Zn_4Sb_3$ material.

13. A unicouple as in claim 1, wherein said second leg includes a Skutterudite material.

14. A unicouple as in claim 1, wherein said second leg includes a $Zn_4Sb_3$ material.

15. A unicouple as in claim 1, wherein said P type material is $Zn_4Sb_3$.

16. A unicouple as in claim 1, further comprising a bonding interface between said first and second segments of each of said first and second legs.

17. A unicouple as in claim 16, wherein said bonding interface comprises an alloy including a noble metal.

18. A unicouple as in claim 17, wherein said alloy includes Ti.

19. A unicouple as in claim 17, wherein said alloy includes Pd.

20. A unicouple as in claim 16, wherein said bonding interface has a coefficient of thermal expansion which is similar to the materials of said first and second segments.

21. A unicouple as in claim 16, wherein said bonding interface has a coefficient of thermal expansion which is intermediate between a coefficient of thermal expansion of the materials of the first and second segments.

22. A unicouple as in claim 1, wherein the second leg includes a skutterudite material and a ratio between said materials is 0.6 for the $Bi_2Te_3$ material, 0.5 for the $Zn_4Sb_3$ material, and 2.7 for the skutterudite material.

23. A thermoelectric device, comprising:

a first leg, formed of N type thermoelectric materials, said first leg having at least first and second segments formed of different N type thermoelectric materials, at least one of said different materials being formed of a $Bi_2Te_3$ alloy;

a second leg, formed of P type thermoelectric materials, said second leg having at least first and second segments formed of different P type materials, at least one of said materials being selected from the group consisting of a skutterudite, an alloy of $Zn_4Sb_3$, or $Bi_2Te_3$; and a connection between said first and second legs.

24. A device as in claim 23, further comprising establishing one end of said unicouple as a hot end and another end as a cold end.

25. A device as in claim 23, further comprising a load connection, connected to receive a current output.

26. A device as in claim 23, wherein said first and second segments of said first lay half different lengths, and said first and second segments of said second lay the also have different lengths.

\* \* \* \* \*

UNITED STATES PATENT AND TRADEMARK OFFICE
CERTIFICATE OF CORRECTION

PATENT NO. : 6,563,039 B2
DATED : May 13, 2003
INVENTOR(S) : Thierry Caillat et al.

It is certified that error appears in the above-identified patent and that said Letters Patent is hereby corrected as shown below:

Column 1,
Line 4, before Related U.S. Application Data, please add the following paragraph:

-- The invention described herein was made in the performance of work under a NASA contract, and is subject to the provisions of Public Law 96-517 (U.S.C. 202) in which the Contractor has elected to retain title. --

Signed and Sealed this

Fourteenth Day of October, 2003

JAMES E. ROGAN
*Director of the United States Patent and Trademark Office*